United States Patent
Focht et al.

(10) Patent No.: US 6,440,764 B1
(45) Date of Patent: Aug. 27, 2002

(54) ENHANCEMENT OF CARRIER CONCENTRATION IN AS-CONTAINING CONTACT LAYERS

(75) Inventors: Marlin Focht, Goleta, CA (US); Ronald Eugene Leibenguth, Palmerton; Claude Lewis Reynolds, Sinking Spring, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/718,962

(22) Filed: Nov. 22, 2000

(51) Int. Cl.$^7$ ................................................. H01L 21/20
(52) U.S. Cl. ........................ 438/22; 438/483; 372/96; 372/45
(58) Field of Search ........................ 438/22, 483, 23, 438/35; 257/102, 198; 372/96, 45; 117/2, 3

(56) References Cited

U.S. PATENT DOCUMENTS

| | | | | |
|---|---|---|---|---|
| 4,965,224 A | * | 10/1990 | Horikawa et al. | 117/101 |
| 5,077,752 A | * | 12/1991 | Tada et al. | 372/102 |
| 5,289,494 A | * | 2/1994 | Tada et al. | 372/45 |
| 5,783,845 A | * | 7/1998 | Kondo et al. | 257/198 |
| 5,790,580 A | * | 8/1998 | Sakata et al. | 257/94 |
| 5,848,088 A | * | 12/1998 | Mori et al. | 372/50 |
| 6,036,769 A | * | 3/2000 | Spurdens et al. | 117/2 |
| 6,159,758 A | * | 12/2000 | Ebert et al. | 438/22 |
| 6,222,863 B1 | * | 4/2001 | Derkits, Jr. et al. | 372/43 |

FOREIGN PATENT DOCUMENTS

| | | | | |
|---|---|---|---|---|
| JP | 03263819 A | * | 11/1991 | H01L/21/205 |
| JP | 06232164 A | * | 8/1994 | H01L/21/338 |

OTHER PUBLICATIONS

N.K. Dutta, Bistability in coupled cavity semiconductor lasers, Applied Physics Letters, Jan. 1, 1984, vol. 44, Issue 1, pp. 30–32.*

Cole et al., Effect of Cooling Ambient on Electrical Activation of Dopants in MOVPE of InP, Electronics Letters 24, 930 (1988), 3 pages.

Antell et al., Passivation of zinc acceptors in InP by atomic hydrogen coming from arsine during metalorganic vapor phase epitaxy, Appl. Phys. Letters 53(9), pp. 758–760, Aug. 1988.

Ishibashi et al., Annealing effects on hydrogen passivation of Zn acceptors in AlGaInP with p–GaAs cap layer grown by metalorganic vapor phase epitaxy, Journal of Crystal Growth, 145 (1994), pp. 414–419.

* cited by examiner

Primary Examiner—Richard Elms
Assistant Examiner—Douglas Menz
(74) Attorney, Agent, or Firm—Christie, Parker & Hale, LLP

(57) ABSTRACT

A method for cooling an MOVPE deposited, As-containing, P-type contact layer includes cooling the contact layer in an arsine environment to preserve the contact layer during the initial stages of the cooling process until a threshold temperature in the range of 560 to 580° C. is attained. During the cooling process, the arsine flow is reduced with respect to the arsine flow used during the MOVPE deposition. After the threshold temperature is attained, the arsine gas is withdrawn and the contact layer is cooled further. Because of the removal of the arsine gas at the threshold temperature, free carrier concentration within the contact layer is enhanced above the atomic concentration of the P-type dopant, and contact resistance is improved to a suitably low level.

17 Claims, 1 Drawing Sheet

ENHANCEMENT OF CARRIER CONCENTRATION IN AS-CONTAINING CONTACT LAYERS

FIELD OF THE INVENTION

The present invention relates, most generally, to semiconductor opto-electronic devices and methods for forming the same. More particularly, the present invention relates to a method for enhancing the carrier concentration within a p-doped contact layer which contains arsenic.

BACKGROUND OF THE INVENTION

Contact layers are formed over semiconductor opto-electronic devices to enable electrical contact to be made to the opto-electronic device through a medium which provides a suitably low contact resistance. High quality ohmic contact is needed between an external electrical wire and the opto-electronic device to allow for high device speed and to minimize the generation of heat in the opto-electronic device. To ensure ohmic contact and a suitably low contact resistance, a first requirement is a clean contact area between the electrical wire joined to the contact layer, and the surface of the contact layer to which it is joined. A second important requirement is for the contact layer to be a material having a suitably low band gap. For this reason, ternary materials such as InGaAs are commonly used. A third requirement for producing a suitably low resistance is a low sheet resistivity of the contact layer material. This is achieved by doping the contact layer with an impurity such as a P-type dopant. The P-type dopant species such as Zn, introduced into the contact layer, includes holes, or free carriers, which provide for the free flow of electrons, i.e. current within the contact layer material. Therefore, a commonly used contact layer material is p-InGaAs which includes Zn as the P-type dopant. Generally speaking, as a higher concentration of P-type dopant, and therefore a higher concentration of free carriers, is included within a contact layer, the sheet resistance and therefore the contact resistance is reduced. It is therefore desirable to incorporate as many free carriers as possible into the contact layer in order to minimize contact resistance.

One shortcoming associated with the incorporation of Zn or any other P-type dopant into a contact layer is that there is an associated saturation level or a physical imitation to the atomic concentration level of the P-type dopant which may be introduced into the contact layer.

A further shortcoming of the present technology and associated with the epitaxial formation of InGaAs as a contact layer, is that arsine, $AsH_3$ is used as a process gas during the formation of the InGaAs contact layer. After the epitaxial process for forming the InGaAs film is completed, an amount of arsine gas is typically retained within the environment within which the contact layer is contained, in order to "preserve" the surface and prevent the unselective loss of arsenic from the layer. The drawback associated with the use of arsine gas in the environment after the film has been formed is that energized atomic hydrogen from the arsine gas passivates the P-type contact layer by complexing with the P-type dopants such as zinc (Zn) to form an electrically neutral Zn—H pair.

The passivation of zinc carriers by atomic hydrogen is discussed in Cole, et al. *Effect of Cooling Ambient on Electrical Activation of Dopants in MOVPE of InP*, Electronics Letters 24, 930 (1988) and Antell, et al. *Passivation of Zinc Acceptors in InP by Atomic Hydrogen coming from Arsine during Metalorganic Vapor Phase Epitaxy*, Appl. Phys. Letters 53(9), 758, August 1988. The Cole article deals with the passivation of zinc carries on InP by atomic hydrogen.

By forming the electrically neutral pair thereby passivation the P-type dopant impurity, the holes or free-carriers associated with the P-type dopant are lost. In this manner, atomic hydrogen from the arsine gas passivates the surface by reducing the free carrier concentration within a film which includes P-type dopant impurities. This increases sheet resistivity and contact resistance. Thus, techniques such as post growth, post-cool down annealing have been developed to minimize such hydrogen passivation. Post growth, post-cool down annealing is discussed by Ishibashi, et al. in *Annealing Effects on Hydrogen Passivaton of Zn Acceptors in AlGaInP with p-GaAs Cap Layer Grown by Metalorganic Vapor Phase Epitaxy*, Journal of Crystal Growth, 145 (1994) 414–419. The Ishibashi, et al. article is directed to passivating underlying layers, not the exposed, upper contact layer.

Furthermore, as device geometries and film thicknesses continue to shrink, the thickness of conventional contact layers is correspondingly reduced. Since P-type dopant impurities such as Zn are typically introduced in-situ during the process of film formation, the concentration of the P-type dopant is relatively homogeneous throughout the formed film. It can therefore be seen that as the film thickness and therefore film volume decreases, the actual number of atomic P-type dopant impurities present in the layer is also diminished. Similarly, there are physically less holes or free carriers present as the thickness of the contact layer is decreased. The hydrogen passivation process described above occurs as atomic hydrogen enters the film through a top exposed surface, and the extent of hydrogen passivation is determined by the film growth process conditions and the cool-down conditions. As such, with contact layers being formed to increasingly smaller thicknesses, a greater percentage of the free carriers associated with P-type dopants, may be lost through passivation by hydrogen ions. Stated differently, the contact layers are more sensitive to hydrogen passivation as the film thickness of the contact layer decreases.

An object of the present invention is not only to prevent the above-described loss of free carriers from a p-doped contact layer by hydrogen passivation but, more importantly, to enhance the free carrier concentration above the atomic dopant concentration.

SUMMARY OF THE INVENTION

To address these and other needs, and in view of its purposes, the present invention provides a method for forming a p-doped contact layer over an opto-electronic device using metalorganic vapor phase epitaxy (MOVPE) methods. Arsine, $AsH_3$, is included as a source gas in the epitaxial formation of the p-doped contact layer which is formed to include arsenic as a component. After the MOVPE process is completed and the p-doped contact layer is formed, the structure is cooled within an environment of reduced arsine concentration to preserve the surface of the contact layer until a threshold temperature within the range of 560° C. to 580° C. is attained, then the arsine is completely withdrawn from the environment to enhance the free carrier concentration of the P-type dopants above the atomic concentration of the P-type dopants. Contact resistance is thereby reduced.

BRIEF DESCRIPTION OF THE DRAWING

The invention is best understood from the following detailed description when read in conjunction with the accompanying drawing. It is emphasized that, according to common practice, the various features of the drawing are not to-scale. On the contrary, the dimensions of the various features are arbitrarily expanded or reduced for clarity. Included in the drawing are the following figures, each of which shows a cross-sectional view.

DETAILED DESCRIPTION OF THE INVENTION

The present invention provides a method for enhancing the free carrier concentration of a p-doped contact layer formed over an opto-electronic device by preserving the As-containing contact layer within an $AsH_3$ (arsine) environment until a threshold temperature is achieved, as the device is cooled after the formation of the contact layer by MOVPE methods. After the threshold temperature is achieved, the $AsH_3$ source gas is completely withdrawn from the environment and the device is cooled further, in an environment void of arsine. While the absence of atomic hydrogen during this time precludes passivation of the P-type dopant impurities by hydrogen as described in the previous references, more importantly, the withdrawal of arsine at a sufficiently high threshold temperature during the post-growth cool down process, enhances free carrier concentration above the atomic concentration of the P-type dopant. This produces a suitably low sheet resistivity of the p-doped contact layer. According to this method, the present invention includes a suitably preserved As-containing, p-doped contact layer surface, while enhancing the free carrier concentration within the layer, thereby reducing contact resistance.

Figure 1:
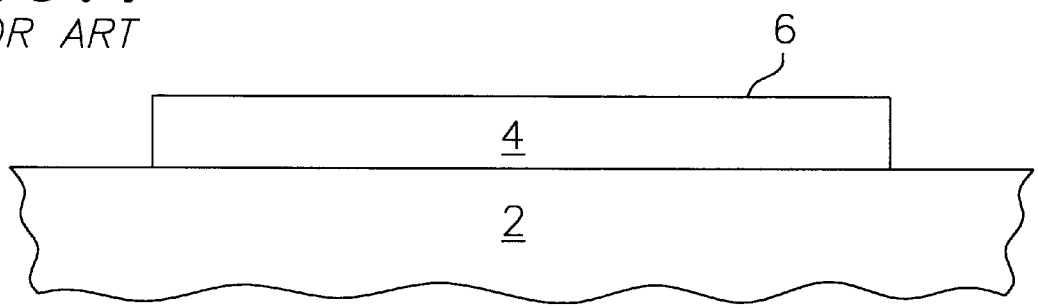
FIG. 1 shows an opto-electronic device formed over a substrate according to the prior art.

Now turning to FIG. 1, opto-electronic device 4 is formed over substrate 2. Substrate 2 may be a semiconductor substrate such as indium phosphide or a silicon wafer such as commonly used in the semiconductor industry. Other suitable substrates may be used alternatively. Opto-electronic device 4 may be a conventional opto-electronic device such as a laser, a modulator, an optical detector, a waveguide, an EML (electro-absorption modulation laser), or any other conventional opto-electronic device. As such, the structure shown in FIG. 1 and upon which the contact layer of the present invention will be formed, may be considered prior art. Opto-electronic device 4 may be formed using any of various conventional methods and will generally represent a composite structure of a waveguide layer interposed between cladding layers. Other structures may be used alternatively. According to an exemplary embodiment, top surface 6 will be formed of an upper, P-type cladding layer such as p-InP. According to other exemplary embodiments, top surface 6 may be formed of other layers, depending in part on the substrate and the opto-electronic device.

Figure 2:
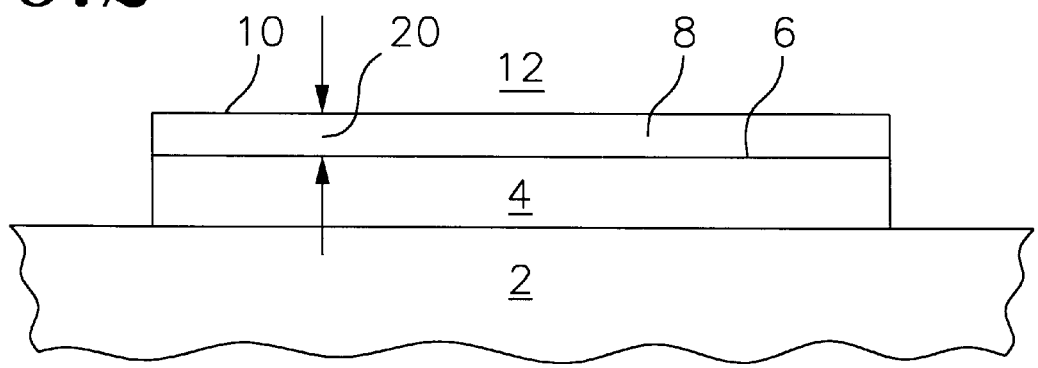
FIG. 2 shows a contact layer formed by the method of the present invention over the opto-electronic device shown in FIG. 1.

Contact layer 8 is then formed over top surface 6 of opto-electronic device 4 as shown in FIG. 2. Contact layer 8 includes thickness 20 which may be no greater than 1000 Å according to an exemplary embodiment, but other thicknesses ranging from 500 Å to 5000 Å may be used alternatively. Contact layer 8 is formed using metalorganic vapor phase epitaxial (MOVPE) methods. MOVPE methods may be alternatively referred to as MOCVD (metalorganic chemical vapor deposition) techniques. Conventional MOVPE methods are used to form contact layer 8 to include arsenic as a component. According to the preferred embodiment, contact layer 8 is a ternary film which includes In, Ga, and As. The materials may be present in any combination, for example—they may be present according to a stoichiometric ratio.

The method for forming contact layer 8 includes arsine, $AsH_3$ as a processor source gas and the formed contact layer 8 therefore includes As a component thereof. According to an exemplary embodiment, contact layer 8 may be a single film and may be alternatively referred to as contact film 8. According to various exemplary embodiments, metalorganics trimethylindium, $(CH_3)_3$ In and triethylgallium, $(C_2H_6)_3$Ga may additionally be included as process sources. According to an exemplary embodiment, a carrier gas such as nitrogen or molecular hydrogen may additionally be included. The molecular hydrogen gas may be fed through a metalorganic bubbler according to conventional methods. According to the preferred embodiment, the MOVPE film formation procedure will take place within a closed pressure-controlled process chamber into which the arsine source gas and other metalorganic source gasses such as trimethylindium and triethylgallium, are introduced. In an exemplary embodiment, the arsine gas may be introduced at a flow rate of 100 sccm, but other flow rates may be used alternatively. For example, an arsine flow rate within the range of 50 sccm to 150 sccm may be used.

The film formation process for forming contact layer 8, takes place at an elevated temperature and a reduced pressure. According to an exemplary embodiment, contact layer 8 may be formed using a maximum film formation temperature of about 650° C., but other maximum film formation temperatures may be used alternatively. According to various exemplary embodiments, the maximum film formation temperatures may range from 550° C. to 700° C., and according to a preferred embodiment a maximum film formation temperature of at least 650° C. may be used. According to an exemplary embodiment, the environment in which the film formation occurs may be maintained at a pressure of 100 torr or less, but other pressures may be used alternatively. This environment may be the closed pressure-controlled process chamber according to the preferred embodiment.

Contact film 8 is a p-doped contact layer. According to the preferred embodiment, a P-type dopant in contact layer 8 such as zinc, Zn, is incorporated into the film, in-situ, during the film formation process. According to a preferred embodiment, the source of zinc may be a dimethylzinc $(CH_3)_2Zn$ which is introduced to the process chamber along with a hydrogen carrier gas, during the film formation process. In this manner, the film will be formed to include Zn as a P-type dopant upon formation. According to other exemplary embodiments, other methods for introducing the P-type dopant impurity into contact layer 8, may be used. Also according to other exemplary embodiments, other P-type dopants such as magnesium (Mg), beryllium (Be), and carbon (C), may be used alternatively.

According to an exemplary embodiment in which Zn is the P-type dopant introduced in-situ into the contact layer during the film formation process, the atomic concentration of Zn within the film may be on the order of $0.6–1.0 \times 10^{19}$ atoms/cm$^3$. A dopant concentration value within this range approaches the saturation level, or the physical limit of the number of Zn atoms which may be incorporated into the contact film 8. Generally speaking, each P-type dopant such as Zn will include holes or free carriers associated with it. In this manner, the free carrier concentration within the film equals the atomic concentration of the P-type dopant within the film, multiplied by the number of holes associated with each P-type dopant atom. As will be described, the present invention provides for enhancing the free-carrier concentration in contact film 8, significantly above that of the atomic concentration of the P-type dopant.

After contact layer 8 is formed to the desired thickness 20 and therefore film formation is complete, the film is cooled. The cooling process may simply include allowing the film to cool until room temperature is achieved, or it may include actively cooling the film using conventional means. According to an exemplary embodiment wherein the contact layer is formed within a process chamber and remains within the process chamber during cooling, the temperature of the process chamber may be reduced using any of conventionally available methods such as by introducing cooled inert gasses into the process chamber. Other conventional methods for actively cooling contact layer 8 may be used alternatively. The cooling process begins at the maximum film formation temperature, which may be on the order of at least 650° C. according to an exemplary embodiment.

Still referring to FIG. 2, during the cooling process contact layer 8 is maintained within an environment 12 which includes arsine gas, during the initial stages of the cooling process. The arsine gas is included within environment 12 in order to preserve surface 10 of contact layer 8 but the concentration of the arsine source gas within environment 12 is reduced relative to the arsine concentration used during the MOVPE formation of contact layer 8. By preserve it is meant that void formation due to the loss of arsenic from contact layer 8 is prevented. In an exemplary embodiment, during the initial stages of the cooling procedure, opto-electronic device 4 is maintained within the process chamber and arsine gas is introduced into the chamber at a reduced flow rate when compared to the flow rate of the arsine source gas (50–150 sccm typically) during MOVPE film formation. In an exemplary embodiment, arsine gas may be introduced at a flow rate of 5 sccm during initial cooling stages, but other flow rates not greater than 10 sccm may be used alternatively. According to an exemplary embodiment, environment 12 may be maintained to include a pressure ranging from 40 torr to 100 torr. During the initial stages of the cooling procedure, additional gasses such as nitrogen or molecular hydrogen may be included within environment 12.

Once a threshold temperature is achieved as the structure cools, the arsine source gas is completely withdrawn from environment 12 and no further arsine gas is introduced. In other words, after the threshold temperature is achieved, environment 12 is devoid of arsine gas and therefore atomic hydrogen. After the threshold temperature is achieved, however, other gasses such as the nitrogen or molecular hydrogen which may have been included during the initial stages of the cooling process, continue to remain within environment 12. In an exemplary embodiment wherein the cooling occurs within the process chamber, the other gasses such as nitrogen or molecular hydrogen or both, continue to be introduced into the process chamber after the threshold temperature is achieved. In either case, after the threshold temperature is achieved, atomic hydrogen is absent from the environment so it cannot complex with and passivate the P-type dopants contained within contact layer 8.

The threshold temperature is chosen so that contact layer 8 has been sufficiently preserved and that the subsequent removal of arsine gas from the environment will not result in voids due to arsenic loss from contact layer 8 during the continued cooling process. Contact layer 8 must be sufficiently preserved by the time the threshold temperature is achieved. The threshold temperature is also chosen to be the temperature achieved during the cooling process, which enhances the free carrier concentration above the atomic concentration of the P-type dopant in contact layer 8.

According to the exemplary embodiment wherein a maximum film formation temperature of 650° C. is utilized and the structure is allowed to passively cool to a room temperature over the period of 30 minutes to 1 hour, a threshold temperature of 570° C. may be used. According to other exemplary embodiments, threshold temperatures ranging from 560° C.–580° C. may be used. According to other exemplary embodiments wherein the maximum film formation is different than 650° C., and depending on film thickness and flow rate of arsine gas during the initial stages of the cooling, other threshold temperatures may be used which lie within the range of 550° C.–600° C. In summary, the threshold temperature will be chosen in conjunction with the processing parameters identified above, and will be chosen to enhance free carrier concentration, while sufficiently preserving contact layer 8. Arsine is withdrawn from the environment once the threshold temperature is attained.

By withdrawing the arsine gas from the environment once the threshold temperature is attained, the free carrier concentration is enhanced above the atomic concentration of the P-type dopant in contact layer 8, and passivation of p-dopants is also prevented. This results in a minimized sheet resistivity of the contact layer and provides for a suitably low and minimized contact resistance.

According to various exemplary trials utilizing the free carrier enhancement method of the present invention, atomic P-type atomic dopant concentration values ranging from $0.6-1.0\times10^{19}$ atoms/cm$^3$ as measured using Secondary Ion Mass Spectroscopy (SIMS), have yielded free carrier concentrations within the range of $5-10\times10^{19}$ free carriers/cm$^3$ as measured using Polaron—CV (capacitance-voltage) measurement techniques. A significant enhancement of free carrier concentration often times greater than the atomic P-type dopant concentration has been achieved. The corresponding improvement in contact resistance is a reduction in contact resistance from values within the range of $1-2\times10^{-5}$ ohms/cm$^2$ to contact resistance values within the range of $3-5\times10^{-5}$ ohms/cm$^2$.

It is to be emphasized at this point that the above-described embodiments are intended to be exemplary only. It is again emphasized that the particular threshold temperature is chosen in conjunction with the various processing conditions used to form and cool the P-type contact layer. According to various exemplary trials, the atomic dopant concentration of a contact layer (measured using SIMS) yielded an associated, electrically measured free carrier concentration being 10 times greater than the atomic p-dopant atom concentration, when formed and cooled according to the method of the present invention.

Figure 3:
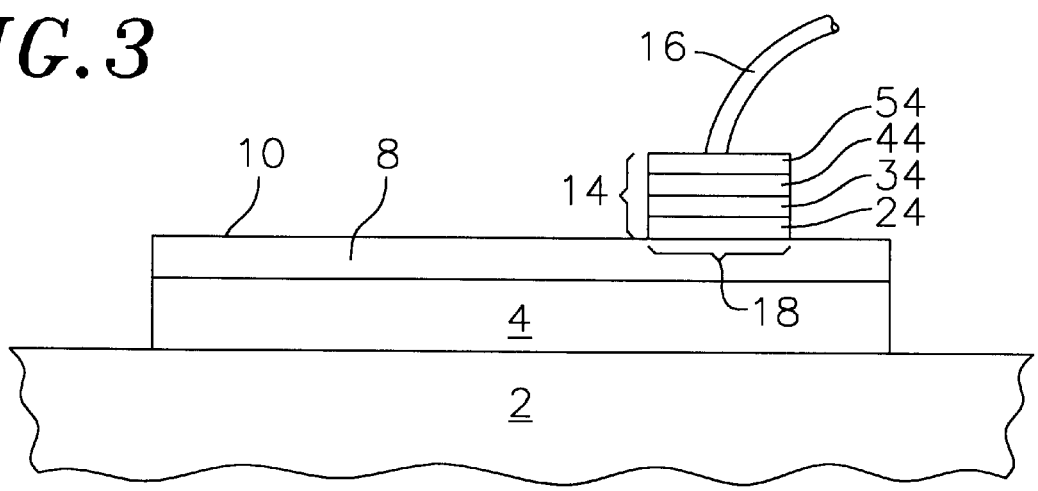
FIG. 3 shows the opto-electronic device shown in FIG. 2, after a contact structure has been joined to the contact layer.

FIG. 3 shows the structure shown in FIG. 2 after a contact structure 14 has been joined to surface 10 of contact layer 8. Contact structure 14 is joined to surface 10 at contact area 18 and is not alloyed. Contact resistance between non-alloyed contact structure 14 and opto-electronic device 4 is determined by the above-described free carrier aspects of contact layer 8 as well as the quality and integrity of the procedure used to join contact structure 14 to contact layer 8 in contact region 18 and also the cleanliness of contact region 18. Conventional methods for forming and defining the shape of contact structure 14 may be used. Electrical wire 16 provides for electrical contact with external features (not shown). In an exemplary embodiment, contact structure 14 may include first film 24 being a platinum film on the order of about 50 Å, second film 34 being a titanium film on the order of about 500 Å, third film 44 being a platinum film on the order of about 500 Å, and upper film 54 being a gold film on the order of 2000 Å. The contact structure is intended to be exemplary only and other films, other combinations of films, and other thicknesses may be used alternatively.

The preceding merely illustrates the principles of the invention. It will thus be appreciated that those skilled in the art will be able to devise various arrangements which although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed:

1. A method for forming a contact layer over an opto-electronic device comprising the steps of:
    (a) providing an opto-electronic device;
    (b) forming a contact layer over said opto-electronic device using a metalorganic vapor phase epitaxy (MOVPE) process, said MOVPE process including a pressure less than 100 millitorr, a maximum formation temperature exceeding a threshold temperature, and $AsH_3$ as a process source gas, said $AsH_3$ maintained at a first concentration and said contact layer therefore including As therewithin and remaining uncovered;
    (c) after said contact layer is formed, allowing said uncovered contact layer to cool to said threshold temperature while maintaining said uncovered contact layer within an environment including $AsH_3$, said $AsH_3$ maintained at a second concentration being less than said first concentration and said threshold temperature being within the range of 560° C. to 580° C.;
    (d) removing said $AsH_3$ from said environment once said threshold temperature is achieved; and
    (e) allowing said opto-electronic device to further cool.

2. The method as in claim 1, wherein step (b) comprises forming said contact layer to be a ternary compound including In, Ga, and As.

3. The method as in claim 1, in which step (b) includes forming said contact layer to include a P-type dopant impurity therein.

4. The method as in claim 1, in which step (b) includes forming said contact layer to include Zn as a dopant impurity therein.

5. The method as in claim 4, wherein an atomic concentration of said Zn within said contact layer lies within the range of $0.6 \times 10^{19}$ atoms/cm$^3$ to $1.0 \times 10^{19}$ atoms/cm$^3$ to $1.0 \times 10^{19}$ atoms/cm$^3$.

6. The method as in claim 1, in which said step (b) includes forming said contact layer to include one of Mg, Be, and C as a P-type dopant impurity therein.

7. The method as in claim 1, in which step (b) includes disposing said opto-electronic device within a process chamber and introducing said $AsH_3$ into said process chamber at a first flow rate, and
    step (c) includes maintaining said opto-electronic device within said process chamber and introducing said $AsH_3$ into said process chamber at a second flow rate being less than said first flow rate.

8. The method as in claim 7, in which step (b) includes said first flow rate being within the range of 50 sccm–150 sccm and step (c) includes said second flow rate being not greater than 10 sccm.

9. The method as in claim 7, in which said step (c) further includes introducing at least one of nitrogen and molecular hydrogen into said process chamber, and
    step (d) includes maintaining said contact layer within said process chamber and further includes introducing said at least one of nitrogen and molecular hydrogen into said process chamber.

10. The method as in claim 1, in which step (b) includes forming said contact layer to a thickness no greater than 1000 Å.

11. The method as in claim 1, in which step (b) includes said maximum formation temperature being at least 650° C.

12. The method as in claim 1, in which said step (a) includes providing one of a laser, a modulator, an optical detector, a waveguide, and an electro-absorption modulation laser.

13. The method as in claim 1, in which step (c) includes said environment further including at least one of nitrogen and molecular hydrogen.

14. The method as in claim 1, in which said step (b) includes forming said contact layer within a process chamber, said step (c) includes maintaining said contact layer within said process chamber and maintaining a pressure of said environment ranging from 40 torr to 100 torr.

15. The method as in claim 1, further comprising step (f) forming a non-alloyed contact structure on said contact layer, said contact structure formed of at least one of Pt, Au, and Ti.

16. The method as in claim 1, in which said step (b) further includes $(CH_3)_3In$, $(C_2H_6)_3Ga$ and $(CH_3)_2Zn$ as further process sources.

17. A method for forming a contact layer over an opto-electronic device comprising the steps of:
    (a) providing an opto-electronic device;
    (b) locating said opto-electronic device within a process chamber;
    (c) within said process chamber, forming a Zn-doped InGaAs contact layer over said opto-electronic device using a metalorganic vapor phase epitaxy (MOVPE) process, said MOVPE process including $AsH_3$, $(CH_3)_3In$, $(C_2H_3)_3Ga$, and $(CH_3)_2Zn$ as process gasses, a maximum formation temperature of at least 650° C., and a pressure less than 100 millitorr, said $AsH_3$ being introduced into said process chamber at a flow rate ranging from 50 sccm to 150 sccm;
    (d) after said contact layer is formed, allowing said contact layer to cool to a threshold temperature within the range of 560° C.–580° C. while introducing $AsH_3$ gas into said process chamber at a flow rate not greater than 10 sccm and further introducing at least one of nitrogen and molecular hydrogen into said process chamber;

(e) once said threshold temperature is achieved, removing said $AsH_3$ from said process chamber while maintaining said flow of said at least one of nitrogen and molecular hydrogen into said process chamber; and (f) allowing said opto-electronic device to further cool below said threshold temperature.

* * * * *